United States Patent
Lee et al.

(10) Patent No.: US 10,418,523 B2
(45) Date of Patent: Sep. 17, 2019

(54) LIGHT-EMITTING DEVICE AND LIGHT-EMITTING DEVICE PACKAGE

(71) Applicant: LG INNOTEK CO., LTD., Seoul (KR)

(72) Inventors: Sang Youl Lee, Seoul (KR); Hoe Jun Kim, Seoul (KR); Sung Ho Jung, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/561,432

(22) PCT Filed: Mar. 16, 2016

(86) PCT No.: PCT/KR2016/002637
§ 371 (c)(1),
(2) Date: Sep. 25, 2017

(87) PCT Pub. No.: WO2016/153214
PCT Pub. Date: Sep. 29, 2016

(65) Prior Publication Data
US 2018/0122991 A1  May 3, 2018

(30) Foreign Application Priority Data

Mar. 26, 2015 (KR) .................. 10-2015-0042676

(51) Int. Cl.
*H01L 33/38* (2010.01)
*H01L 33/36* (2010.01)
(Continued)

(52) U.S. Cl.
CPC ............ *H01L 33/387* (2013.01); *H01L 33/36* (2013.01); *H01L 33/06* (2013.01); *H01L 33/32* (2013.01);
(Continued)

(58) Field of Classification Search
CPC .................................................. H01L 33/387
See application file for complete search history.

(56) References Cited

U.S. PATENT DOCUMENTS

| 5,955,759 A | 9/1999 | Ismail et al. |
| 2003/0230754 A1 | 12/2003 | Steigerwald et al. |

(Continued)

FOREIGN PATENT DOCUMENTS

| CN | 1738066 A | 2/2006 |
| CN | 101241963 A | 8/2008 |

(Continued)

OTHER PUBLICATIONS

International Search Report for PCT/KR2014/002637 (PCT/ISA/210) dated May 27, 2016.

*Primary Examiner* — Grant S Withers
(74) *Attorney, Agent, or Firm* — Birch, Stewart, Kolasch & Birch, LLP

(57) ABSTRACT

A light-emitting device in an embodiment includes a substrate, a light-emitting structure which is disposed on the substrate and includes a first conductive semiconductor layer, an active layer, and a second conductive semiconductor layer, first and second electrodes which are respectively connected to the first and second conductive semiconductor layers, first and second bonding pads respectively connected to the first and second electrodes, and an insulating layer disposed between the first bonding pad and the second electrode, and between the second bonding pad and the first electrode. The first thickness of the first electrode may be ⅓ or less of the second thickness of the insulating layer disposed between the second bonding pad and the first electrode.

14 Claims, 11 Drawing Sheets

(51) Int. Cl.
 *H01L 33/62* (2010.01)
 *H01L 33/06* (2010.01)
 *H01L 33/32* (2010.01)
 *H01L 33/44* (2010.01)
 *H01L 33/50* (2010.01)
 *H01L 33/54* (2010.01)

(52) U.S. Cl.
 CPC ............ *H01L 33/382* (2013.01); *H01L 33/44* (2013.01); *H01L 33/507* (2013.01); *H01L 33/54* (2013.01); *H01L 33/62* (2013.01); *H01L 2224/16245* (2013.01)

(56) References Cited

U.S. PATENT DOCUMENTS

| | | |
|---|---|---|
| 2007/0228393 A1 | 10/2007 | Yoneda |
| 2014/0124821 A1* | 5/2014 | Tomonari ............... H01L 33/38 257/99 |
| 2015/0280071 A1* | 10/2015 | Takenaga ............... H01L 33/382 257/99 |
| 2015/0333230 A1* | 11/2015 | Moon ................... H01L 27/156 257/88 |
| 2016/0260869 A1* | 9/2016 | Jeon ....................... H01L 33/38 |

FOREIGN PATENT DOCUMENTS

| | | |
|---|---|---|
| CN | 104300069 A | 1/2015 |
| EP | 2325906 A1 | 5/2011 |
| EP | 2525420 A2 | 11/2012 |
| EP | 2782147 A1 | 9/2014 |
| JP | 8-46237 A | 2/1996 |
| JP | 2007-49045 A | 2/2007 |
| KR | 10-1999-0063050 A | 7/1999 |
| KR | 10-2011-0135103 A | 12/2011 |
| KR | 10-2012-0130846 A | 12/2012 |
| KR | 10-2014-0062945 A | 5/2014 |
| KR | 10-2014-0135005 A | 11/2014 |

\* cited by examiner

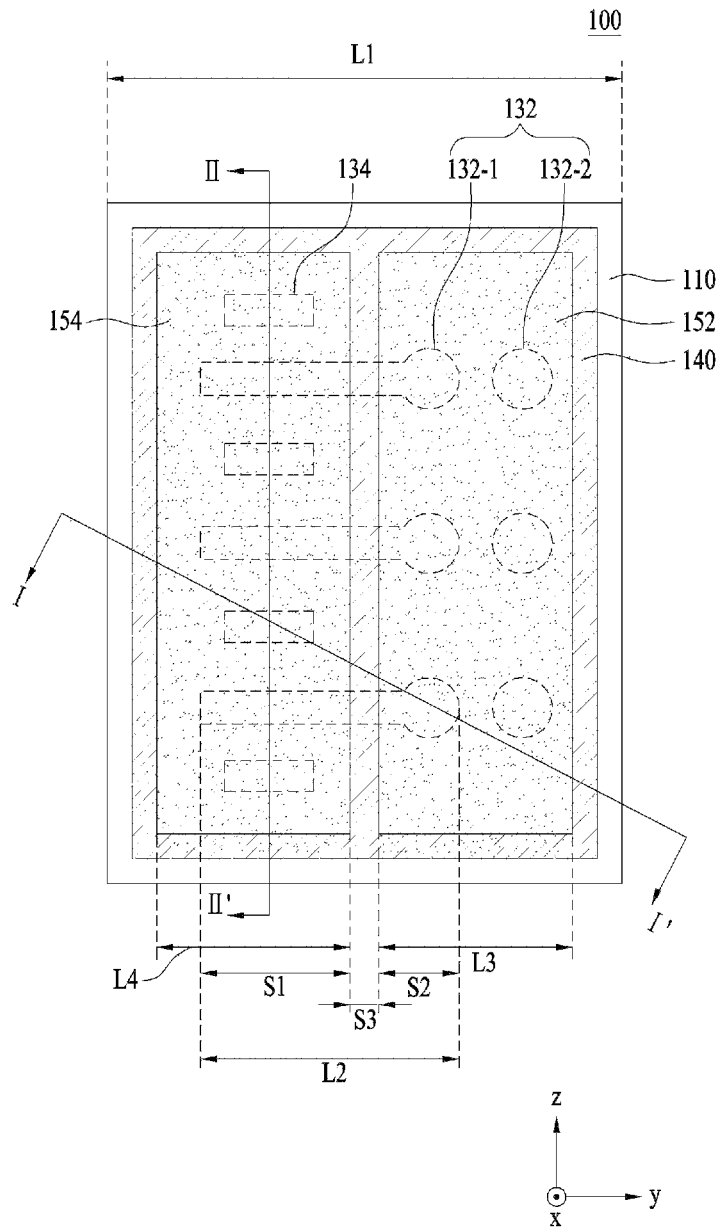
[FIG. 1]

【FIG. 2】
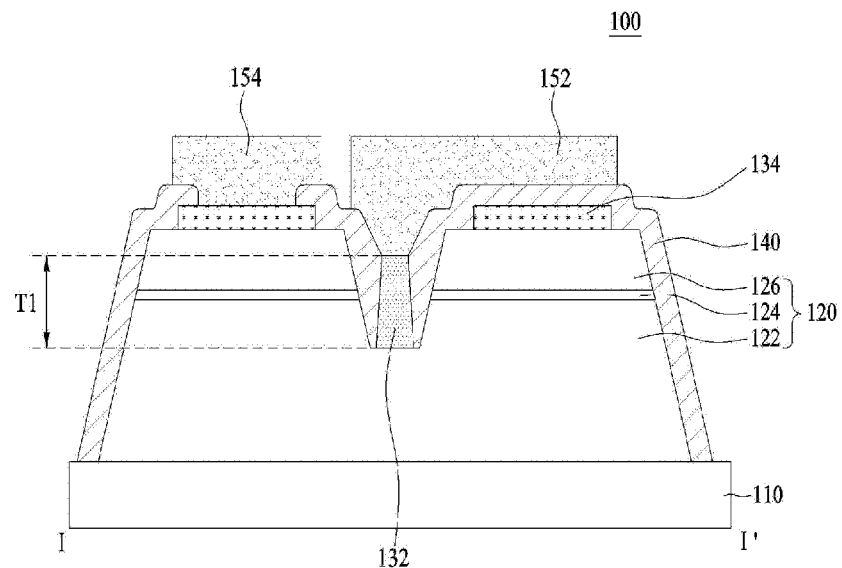
【FIG. 3a】
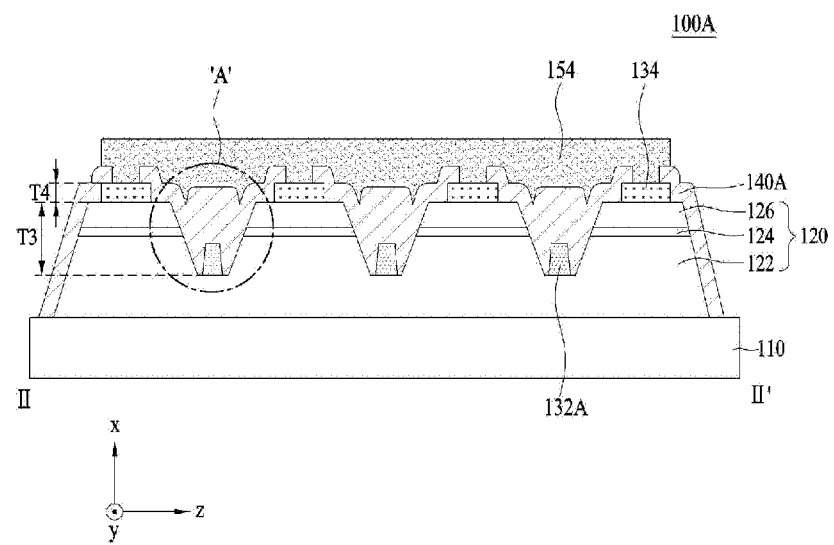

【FIG. 3b】
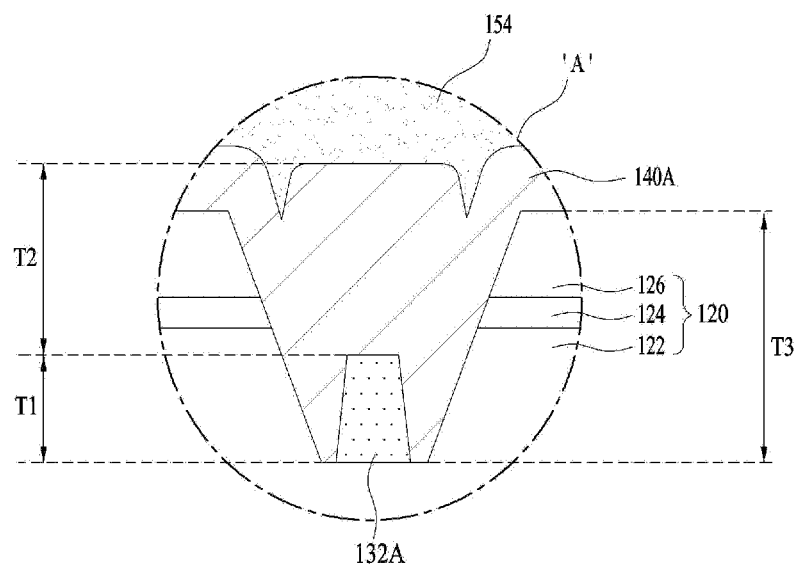
【FIG. 4a】
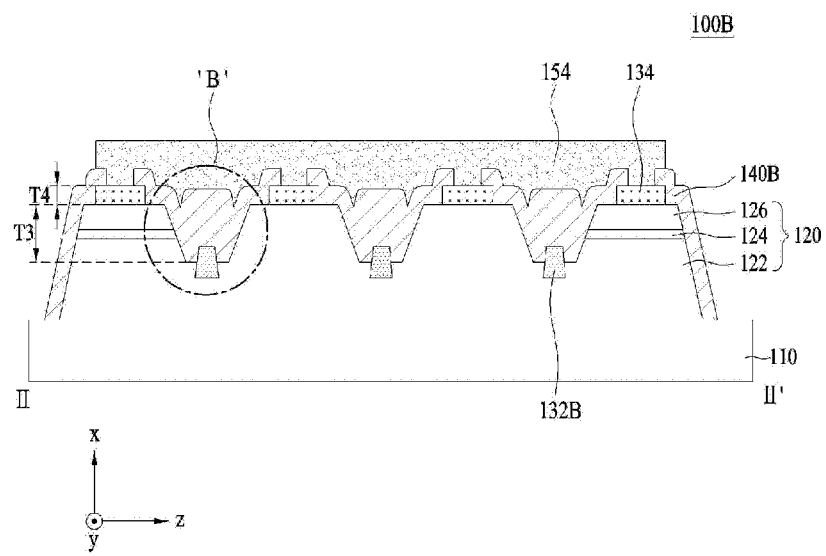

[FIG. 4b]
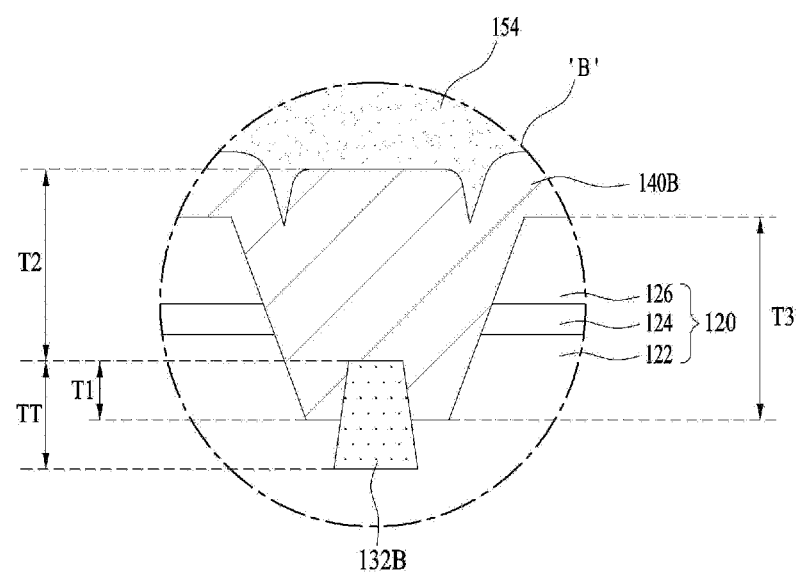
[FIG. 5a]
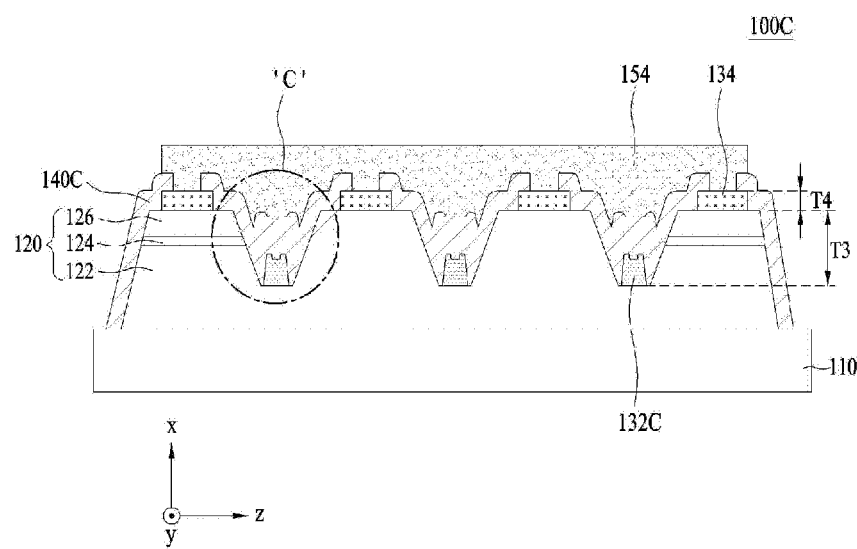

[FIG. 5b]
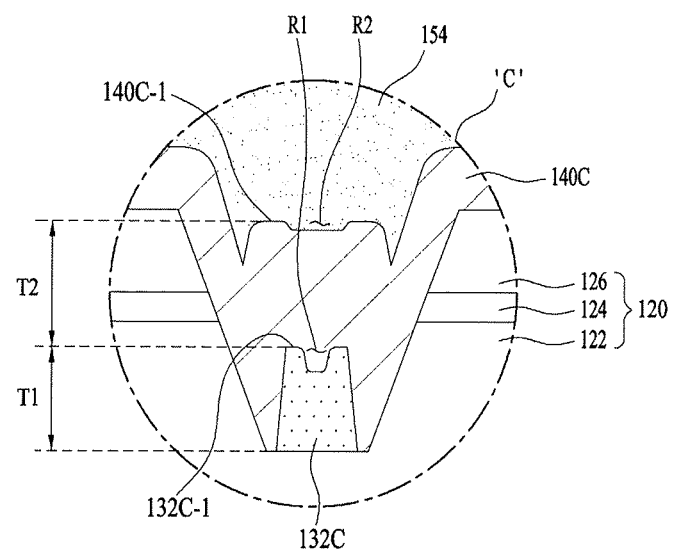
[FIG. 6a]
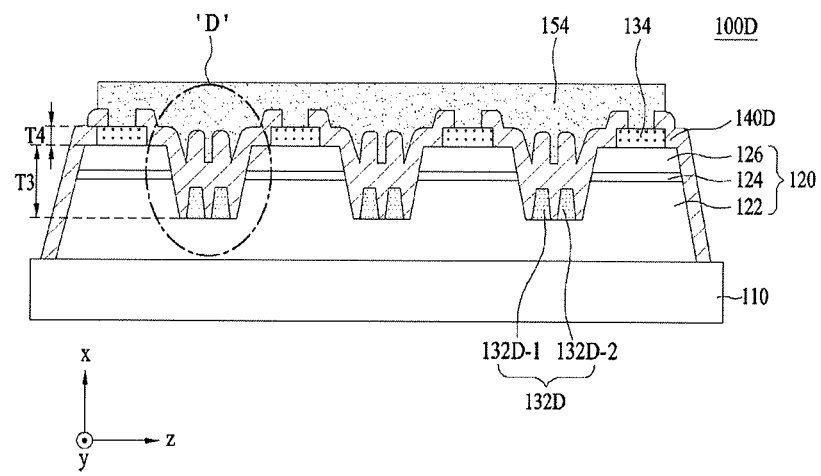

[FIG. 6b]
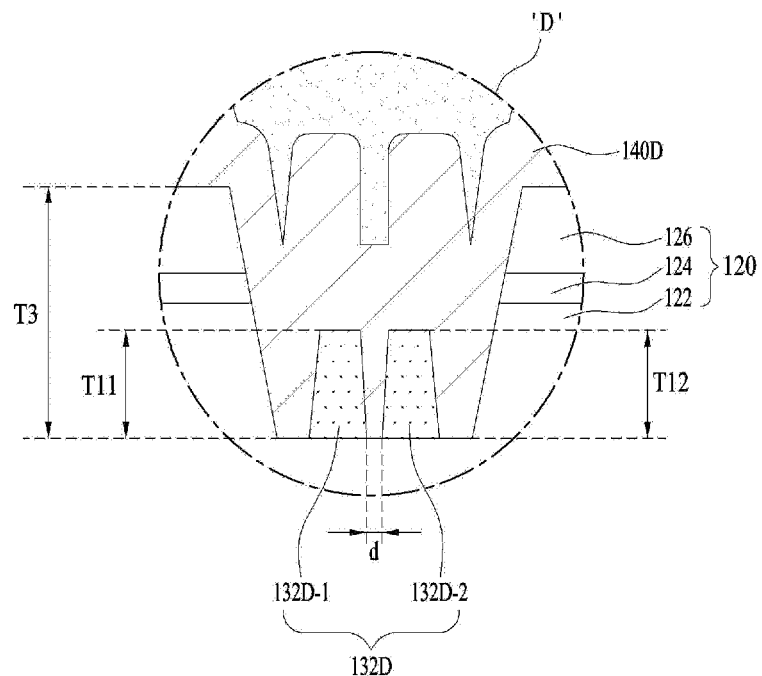
[FIG. 7a]
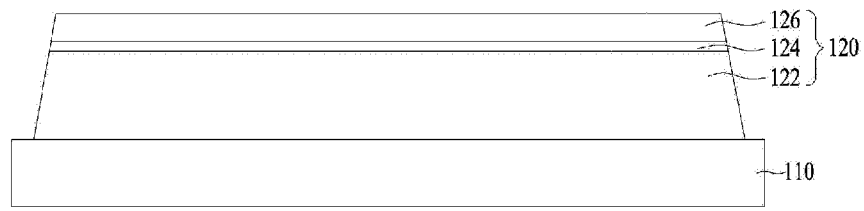
[FIG. 7b]
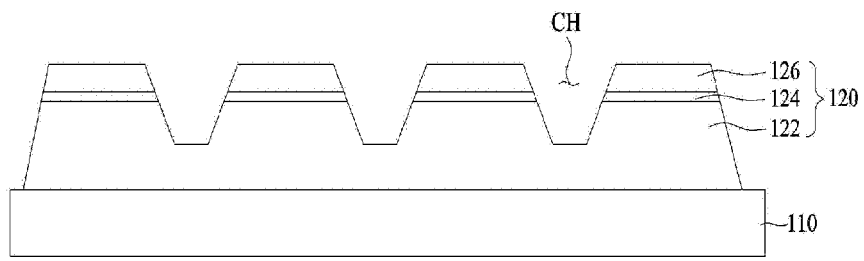

[FIG. 7c]
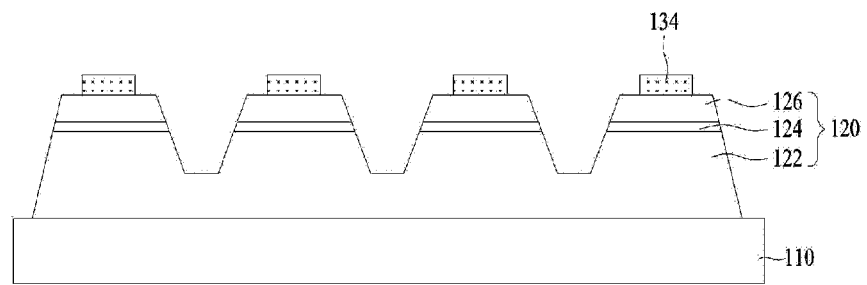
[FIG. 7d]
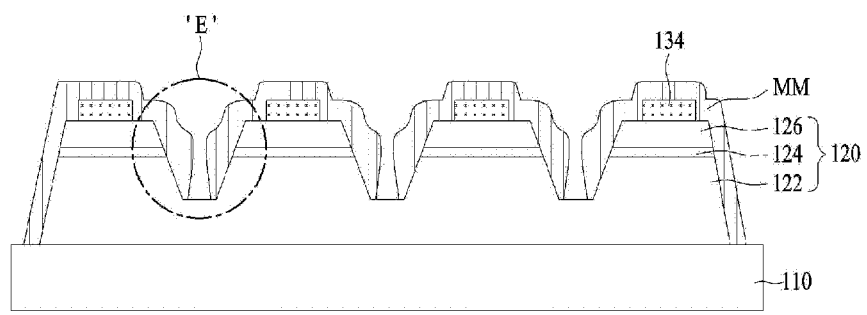
[FIG. 7e]
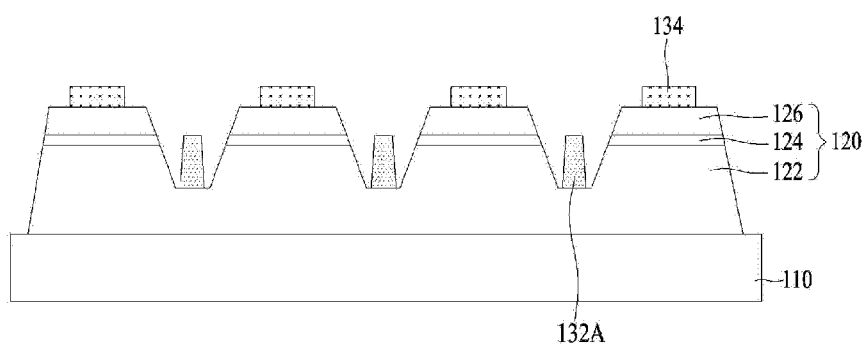

[FIG. 7f]
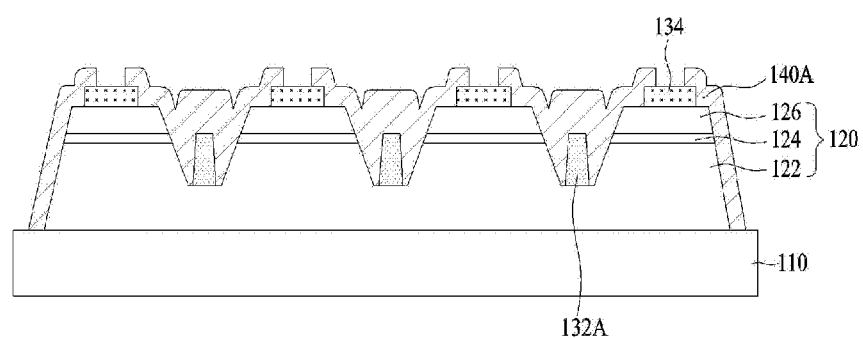
[FIG. 8]
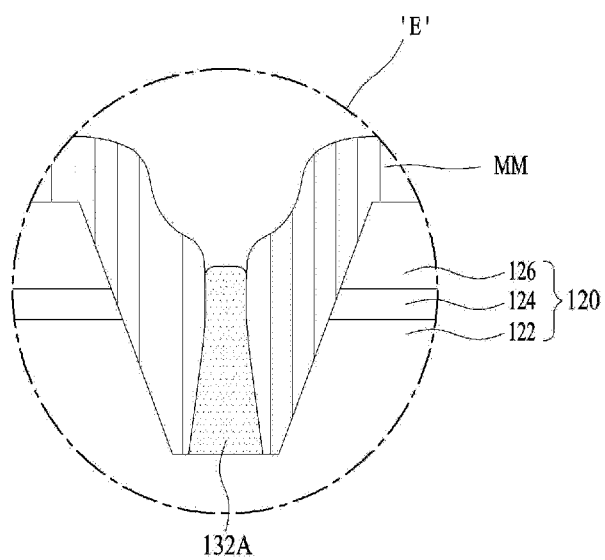

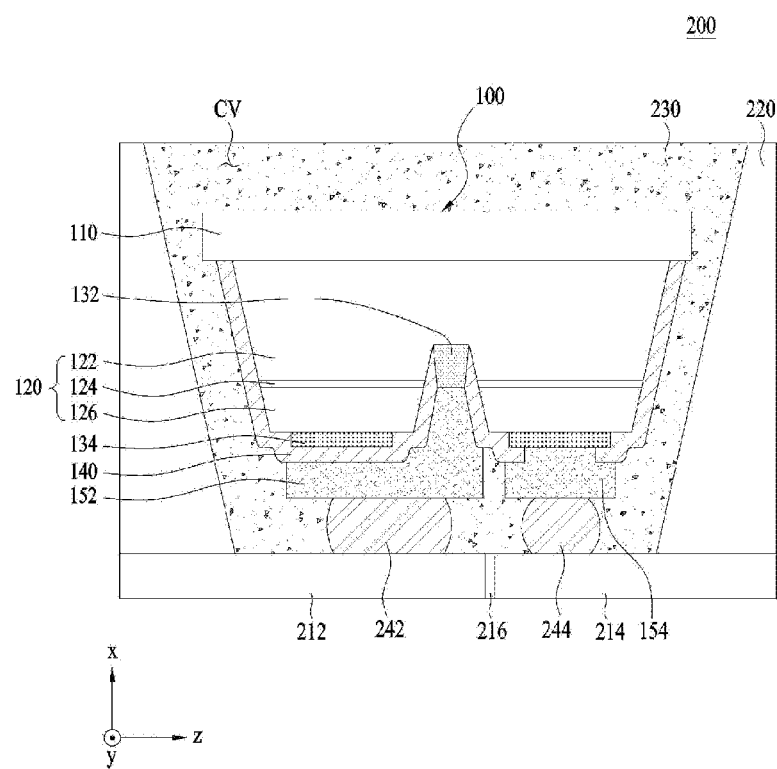
[FIG. 9]

[FIG. 10a]
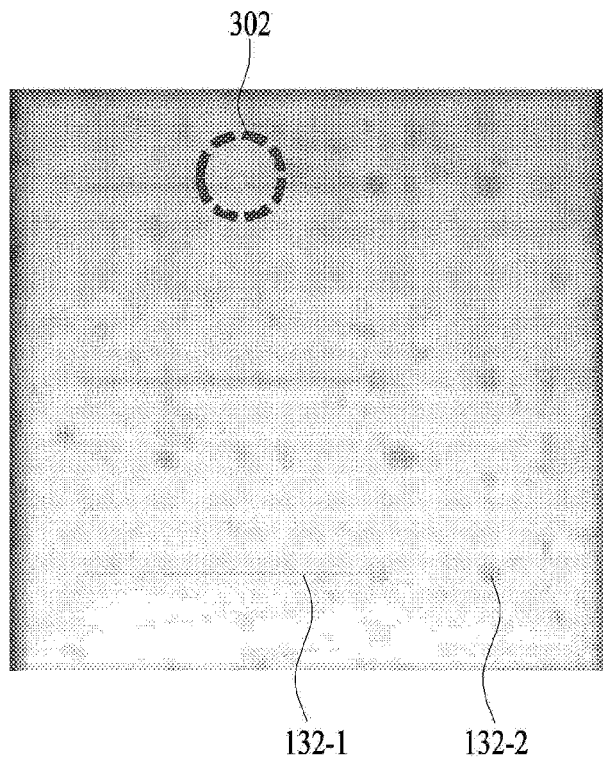
[FIG. 10b]
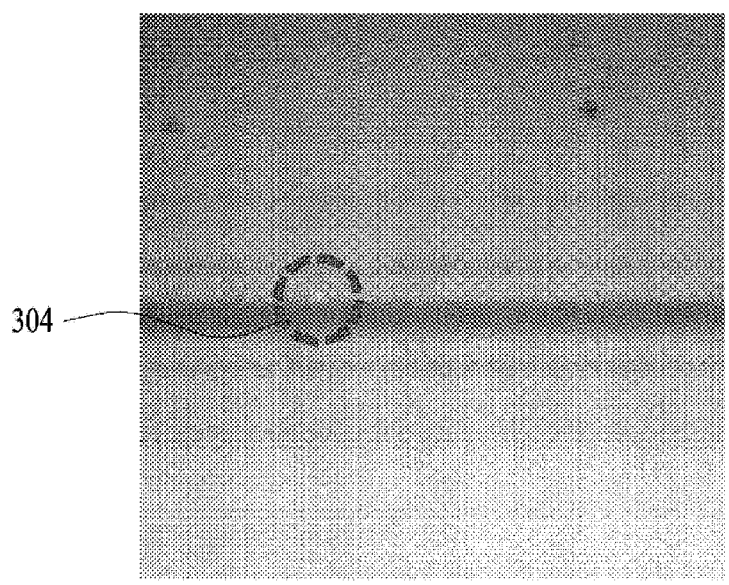

[FIG. 10c]
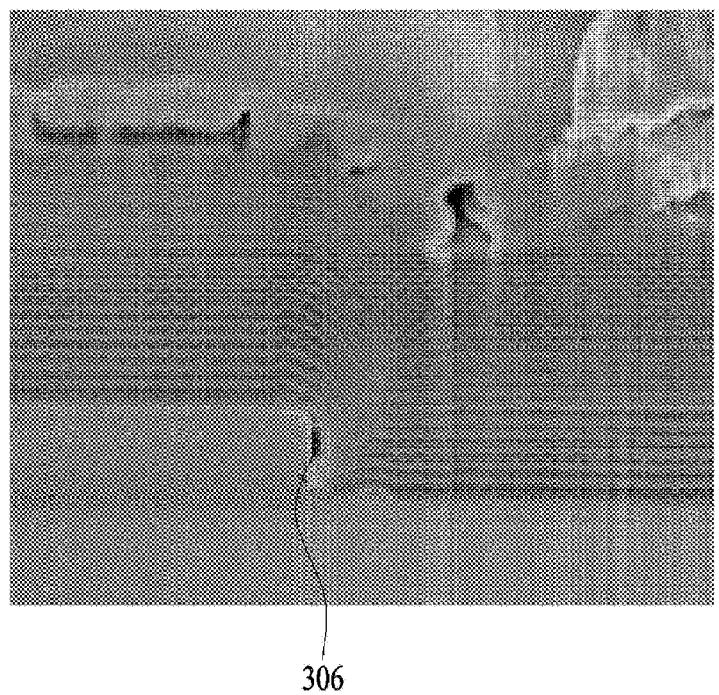
306
[FIG. 11]
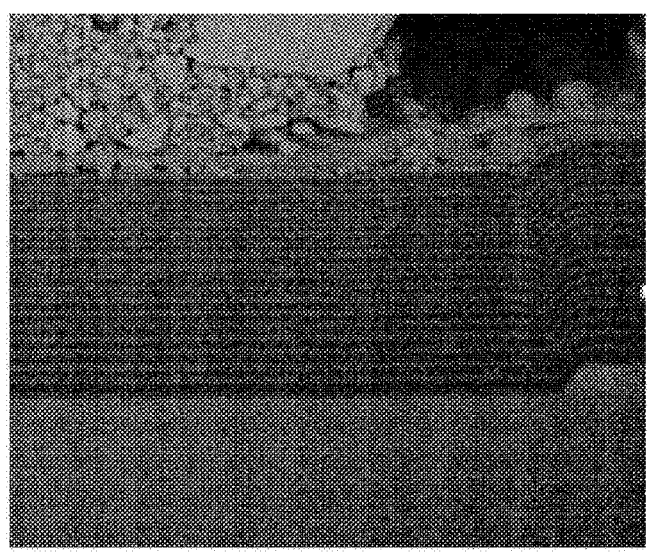

LIGHT-EMITTING DEVICE AND LIGHT-EMITTING DEVICE PACKAGE

CROSS REFERENCE TO RELATED APPLICATIONS:

This application is the National Phase of PCT International Application No. PCT/KR2016/002637, filed on Mar. 16, 2016, which claims priority under 35 U.S.C. 119(a) to Patent Application No. 10-2015-0042676, filed in the Republic of Korea on Mar. 26, 2015, all of which are hereby expressly incorporated by reference into the present application.

TECHNICAL FIELD

Embodiments relate to a light-emitting device and a light-emitting device package.

BACKGROUND ART

Light-emitting diodes (LEDs) are one type of semiconductor device that converts electricity into infrared rays or light using the characteristics of compound semiconductors, in order to transmit or receive signals or to be used as a light source.

Group III-V nitride semiconductors are in the spotlight as a core material for light-emitting devices such as, for example, light-emitting diodes (LEDs) or laser diodes (LDs) thanks to the physical and chemical properties thereof.

Such light-emitting diodes have excellent environmental friendliness because they include no environmentally harmful materials such as mercury (Hg), which has been used in the conventional lighting apparatuses such as, for example, incandescent lamps and fluorescent lamps, and also have other advantages, for example, a long lifespan and low power consumption. Therefore, existing light sources are being replaced with light-emitting diodes.

In the case of an existing light-emitting device package having a flip-chip-bonding structure, an insulating layer, which electrically spaces a p-type bonding pad and an n-type electrode, which overlap each other in the vertical direction, apart from each other, may not be correctly formed because an n-type electrode is thick, which may deteriorate electrical characteristics.

Technical Object

Embodiments provide a light-emitting device and a light-emitting device package having excellent electrical characteristics.

Technical Solution

A light-emitting device according to one embodiment may include a substrate, a light-emitting structure disposed on the substrate and including a first conductive semiconductor layer, an active layer, and a second conductive semiconductor layer, first and second electrodes connected respectively to the first and second conductive semiconductor layers, first and second bonding pads connected respectively to the first and second electrodes, and an insulating layer disposed between the first bonding pad and the second electrode and between the second bonding pad and the first electrode, wherein the first electrode may have a first thickness that is ⅓ or less of a second thickness of the insulating layer disposed between the second bonding pad and the first electrode.

For example, the first electrode may include a branch electrode disposed under the first and second bonding pads, and a contact electrode disposed under the first bonding pad, and the first thickness may be a thickness of the branch electrode. The branch electrode may include a first segment disposed under the second bonding pad, and a second segment disposed under the first bonding pad, and the first thickness may be a thickness of the first segment.

The substrate may have a first length and the branch electrode has a second length in a first direction, and the first length and the second length have a following relationship: $L1 \times 0.7 > L2$ (where, L1 indicates the first length L2 indicates the second length).

The first and second bonding pads may be spaced apart from each other in the first direction, which is orthogonal to a thickness direction of the light-emitting structure.

For example, the branch electrode may further include a third segment disposed between the first segment and the second segment.

For example, a portion of the first segment of the branch electrode may be buried in the first conductive semiconductor layer. The first thickness of the first electrode may be a thickness of a portion of the first electrode that is not buried in the first conductive semiconductor layer, but is exposed.

For example, the first thickness may be 1 μm or less and the second thickness may be 3.3 μm or less.

For example, the first electrode may include a first upper surface that faces the insulating layer, and the first upper surface of the first electrode may have at least one first recess therein. The insulating layer may include a second upper surface disposed on the first electrode, and the second upper surface of the insulating layer may have at least one second recess therein. The first thickness of the first electrode may be greater when the first electrode has the first recess therein than when the first electrode has no first recess therein.

For example, the first electrode may include a plurality of sub-electrodes spaced apart from one another in a direction that is orthogonal to a thickness direction of the light-emitting structure. The first thickness of the first electrode may be greater when the first electrode includes the sub-electrodes than when the first electrode includes no sub-electrodes. The insulating layer may be buried between the sub-electrodes. The sub-electrodes may have different thicknesses, or may have the same thickness. The sub-electrodes may be spaced apart from one another by a distance that is determined in consideration of a processing error to allow the insulating layer to be buried.

For example, the first bonding pad and the second bonding pad may face each other in a first direction, the first bonding pad may have a length in the first direction that is less than a length of the substrate in the first direction, and the second bonding pad may have a length in the first direction that is less than the length of the substrate in the first direction.

For example, the first bonding pad and the second bonding pad may face each other in a first direction, the first bonding pad may have a length in the first direction that is less than a length of the branch electrode in the first direction, and the second bonding pad may have a length in the first direction that is less than the length of the branch electrode in the first direction.

A light-emitting device package according to another embodiment may include the light-emitting device, first and second solder parts connected respectively to the first and second bonding pads, and first and second lead frames electrically connected respectively to the first and second solder parts.

Advantageous Effects

In a light-emitting device and a light-emitting device package according to embodiments, a first electrode has an appropriate first thickness, for example, a thickness of ⅓ or less of a second thickness of an insulating layer. Thereby, the insulating layer may be correctly formed between a second bonding pad and the first electrode, and the slope of the first electrode may be increased, which may prevent the generation of defects in the first electrode and result in excellent electrical characteristics.

DESCRIPTION OF DRAWINGS

FIG. 1 illustrates a plan view of a light-emitting device according to an embodiment.

FIG. 2 illustrates a cross-sectional view of the light-emitting device taken along line I-I' of FIG. 1.

FIG. 3a illustrates a cross-sectional view of one embodiment of the light-emitting device taken along line II-II' of FIG. 1, and FIG. 3b illustrates an enlarged cross-sectional view of portion 'A' of FIG. 3a.

FIG. 4a illustrates a cross-sectional view of another embodiment of the light-emitting device taken along line II-II' of FIG. 1, and FIG. 4b illustrates an enlarged cross-sectional view of portion 'B' of FIG. 4a.

FIG. 5a illustrates a cross-sectional view of still another embodiment of the light-emitting device taken along line II-II' of FIG. 1, and FIG. 5b illustrates an enlarged cross-sectional view of portion 'C' of FIG. 5a.

FIG. 6a illustrates a cross-sectional view of a still another embodiment of the light-emitting device taken along line II-II' of FIG. 1, and FIG. 6b illustrates an enlarged cross-sectional view of portion 'D' of FIG. 6a.

FIGS. 7a to 7f are process cross-sectional views for explaining a method of manufacturing the light-emitting device illustrated in FIG. 3a.

FIG. 8 is an enlarged process cross-sectional view illustrating portion 'E' of FIG. 7d.

FIG. 9 illustrates a cross-sectional view of a light-emitting device package according to an embodiment.

FIG. 10a illustrates a plane photograph of a light-emitting device according to a comparative example, FIG. 10b illustrates a cross-sectional photograph of the light-emitting device according to the comparative example of FIG. 10a, and FIG. 10c illustrates an enlarged cross-sectional photograph of the light-emitting device according to the comparative example of FIG. 10b.

FIG. 11 illustrates a cross-sectional photograph of portion 'A' of the light-emitting device according to the embodiment of FIG. 3b.

BEST MODE

Hereinafter, embodiments will be described in detail with reference to the accompanying drawings, in order to concretely describe the disclosure and to assist in understanding of the disclosure. However, the embodiments disclosed here may be altered into various other forms, and the scope of the disclosure should not be construed as being limited to the embodiments described below. The embodiments disclosed here are provided in order to more completely describe the disclosure to those of ordinary skill in the art.

In the description of the embodiments, when an element is referred to as being formed "on" or "under" another element, it can be directly "on" or "under" the other element or be indirectly formed with intervening elements therebetween. It will also be understood that "on" or "under" the element may be described relative to the drawings.

In addition, relative terms such as, for example, "first", "second", "on/upper/above" and "beneath/lower/below", used in the following description may be used to distinguish any one substance or element with another substance or element without requiring or containing any physical or logical relationship or sequence between these substances or elements.

In the drawings, the thickness or size of each layer may be exaggerated, omitted or schematically illustrated for clarity and convenience of description. In addition, the size of each constituent element does not wholly reflect an actual size thereof.

FIG. 1 illustrates a plan view of a light-emitting device 100 according to an embodiment, and FIG. 2 illustrates a cross-sectional view of the light-emitting device 100 taken along line I-I' of FIG. 1.

Referring to FIGS. 1 and 2, the light-emitting device 100 according to the embodiment may include a substrate 110, a light-emitting structure 120, first and second electrodes 132 and 134, an insulating layer 140, and first and second bonding pads 152 and 154. Here, the first and second bonding pads 152 and 154 may be sorted as constituent elements of the light-emitting device 100, or may be sorted as constituent elements of a light-emitting device package 200, which will be described later.

The light-emitting structure 120 is disposed on the substrate 110. The substrate 110 may contain a conductive material or a non-conductive material. For example, the substrate 110 may contain at least one of sapphire ($Al_2O_3$), GaN, SiC, ZnO, GaP, InP, $Ga_2O_3$, GaAs and Si. In addition, in order to assist light emitted from an active layer 124 in escaping from the light-emitting device 100, the substrate 110 may be, for example, a patterned sapphire substrate (PSS), but the embodiment is not limited thereto.

In order to solve the difference in the coefficient of thermal expansion and lattice-mismatching between the substrate 110 and the light-emitting structure 120, a buffer layer (or a transition layer) (not illustrated) may be disposed between the two 110 and 120. The buffer layer may contain at least one material selected from the group consisting of Al, In, N and Ga, for example, without being limited thereto. In addition, the buffer layer may have a single-layer or multilayer structure.

The light-emitting structure 120 may include a first conductive semiconductor layer 122, the active layer 124, and a second conductive semiconductor layer 126, which are stacked one above another in sequence on the substrate 110.

The first conductive semiconductor layer 122 may be formed of a semiconductor compound such as, for example, a group III-V or II-VI semiconductor compound, which is doped with a first conductive dopant. When the first conductive semiconductor layer 122 is an n-type semiconductor layer, the first conductive dopant may include Si, Ge, Sn, Se, or Te as an n-type dopant, without being limited thereto.

For example, the first conductive semiconductor layer 122 may contain a semiconductor material having a composition formula of $Al_xIn_yGa_{(1-x-y)}N$ (0≤x≤1, 0≤y≤1, 0≤x+y≤1). The first conductive semiconductor layer 122 may contain any one or more selected from among GaN, InN, AlN, InGaN, AlGaN, InAlGaN, AlInN, AlGaAs, InGaAs, AlInGaAs, GaP, AlGaP, InGaP, AlInGaP, and InP.

The active layer 124 is disposed between the first conductive semiconductor layer 122 and the second conductive semiconductor layer 126. The active layer 124 is a layer in which electrons (or holes) introduced through the first conductive semiconductor layer 122 and holes (or electrons) introduced through the second conductive semiconductor layer 126 meet each other to emit light having energy that is determined by the inherent energy band of a constituent material of the active layer 124. The active layer 124 may be formed to have at least one structure among a single-well structure, a multi-well structure, a single-quantum well structure, a multi-quantum well (MQW) structure, a quantum wire structure, and a quantum dot structure.

The active layer 124 may include a well layer and a barrier layer having a pair structure of any one or more selected from among InGaN/GaN, InGaN/InGaN, GaN/AlGaN, InAlGaN/GaN, GaAs(InGaAs)/AlGaAs, and GaP (InGaP)/AlGaP, without being limited thereto. The well layer may be formed of a material having lower band gap energy than the band gap energy of the barrier layer.

A conductive clad layer (not illustrated) may be formed on and/or under the active layer 124. The conductive clad layer may be formed of a semiconductor having higher band gap energy than the band gap energy of the barrier layer of the active layer 124. For example, the conductive clad layer may include, for example, a GaN, AlGaN, InAlGaN or super-lattice structure. In addition, the conductive clad layer may be doped to an n-type or a p-type.

The second conductive semiconductor layer 126 may be disposed on the active layer 124 and may be formed of a semiconductor compound. The second conductive semiconductor layer 126 may be formed of, for example, a group III-V or II-VI semiconductor compound. For example, the second conductive semiconductor layer 126 may contain a semiconductor material having a composition formula of $In_xAl_yGa_{(1-x-y)}N$ ($0 \leq x \leq 1$, $0 \leq y \leq 1$, $0 \leq x+y \leq 1$). The second conductive semiconductor layer 126 may be doped with a second conductive dopant. When the second conductive semiconductor layer 126 is a p-type semiconductor layer, the second conductive dopant may include Mg, Zn, Ca, Sr, Ba a p-type dopant or the like.

The first conductive semiconductor layer 122 may be configured as an n-type semiconductor layer, and the second conductive semiconductor layer 126 may be configured as a p-type semiconductor layer. Alternatively, the first conductive semiconductor layer 122 may be configured as a p-type semiconductor layer, and the second conductive semiconductor layer 126 may be configured as an n-type semiconductor layer.

The light-emitting structure 120 may have any one structure among an n-p junction structure, a p-n junction structure, an n-p-n junction structure, and a p-n-p junction structure.

When the light-emitting device 100 illustrated in FIGS. 1 and 2 has a flip chip bonding structure, light from the active layer 124 is emitted through the substrate 110 and the first conductive semiconductor layer 122. To this end, the substrate 110 and the first conductive semiconductor layer 122 may be formed of a light-transmitting material, and the second conductive semiconductor layer 126 and the second electrode 134 may be formed of a light-transmitting or non-transmitting material.

The first electrode 132 may be connected to the first conductive semiconductor layer 122, and the second electrode 134 may be connected to the second conductive semiconductor layer 126.

Referring to FIG. 1, the first electrode 132 may include a branch electrode 132-1 and a contact electrode 132-2.

The branch electrode 132-1 may be disposed not only under the first bonding pad 152, but also under the second bonding pad 154. The branch electrode 132-1 may include first to third segments S1, S2 and S3. In the branch electrode 132-1, the first segment S1 may mean the portion disposed under the second bonding pad 154. In addition, in the branch electrode 132-1, the second segment S2 may mean the portion disposed under the first bonding pad 152 and the third segment S3 may mean the portion between the first segment S1 and the second segment S2.

The contact electrode 132-2 may not be disposed under the second bonding pad 154, but may be disposed only under the first bonding pad 152.

Each of the branch electrode 132-1 and the contact electrode 132-2 may be electrically connected to the first bonding pad 152, and may be electrically spaced apart from the second bonding pad 154 by the insulating layer 140.

The first electrode 132 may contain an ohmic-contact material, having an ohmic function so that a separate ohmic layer (not illustrated) needs not be necessarily disposed. A separate ohmic layer may be disposed between the first electrode 132 and the first conductive semiconductor layer 122.

In addition, the first electrode 132 may be formed of any material that may not absorb the light emitted from the active layer 124, but that may reflect or transmit the light and that may be grown to a good quality on the first conductive semiconductor layer 122. For example, the first electrode 132 may be formed of a metal, and may be formed of Ag, Ni, Ti, Al, Rh, Pd, Ir, Ru, Mg, Zn, Pt, Au, Hf, Cr, or a selective combination thereof.

The second electrode 134 may be disposed on the second conductive semiconductor layer 126 in the light-emitting structure 120 and may be electrically connected to the second conductive semiconductor layer 126. The second electrode 134 may include a light-transmitting electrode layer (not illustrated) and a reflective layer (not illustrated).

The light-transmitting electrode layer may be disposed on the second conductive semiconductor layer 126, which is exposed by the insulating layer 140, and may serve as an ohmic layer. The light-transmitting electrode layer may be a transparent conductive oxide (TCO) layer. For example, the light-transmitting electrode layer may contain at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, and Ni/IrOx/Au/ITO, but is not limited to these materials.

The reflective layer may be disposed on the light-transmitting electrode layer, and may be configured with aluminum (Al), gold (Au), silver (Ag), nickel (Ni), platinum (Pt), rhodium (Rh), titanium (Ti), chrome (Cr), or a metal layer containing an alloy including Al, Ag, Pt, or Rh.

The first bonding pad 152 may be buried in a contact hole CH, which penetrates the second conductive semiconductor layer 126 and the active layer 124 and exposes the first conductive semiconductor layer 122, and may be electrically connected to the first conductive semiconductor layer 122 via the first electrode 132. The second bonding pad 154 may be electrically connected to the second conductive semiconductor layer 126 via the second electrode 134.

The first bonding pad 152 and the second bonding pad 154 may be spaced apart from each other in the direction (e.g., the y-axis direction) that is orthogonal to the thickness direction (e.g., the x-axis direction) of the light-emitting structure 120. For convenience of description, the y-axis direction is referred to as a "first direction" and the x-axis direction is referred to as a "second direction".

Each of the first and second bonding pads 152 and 154 may contain a metal material having electrical conductivity, and may contain a material that is different from or the same as a corresponding one of the first and second electrodes 132 and 134. Each of the first and second bonding pads 152 and 154 may contain at least one of Ti, Ni, Au or Sn, but the embodiment is not limited thereto.

The insulating layer 140 may be disposed between the first bonding pad 152 and the second electrode 134 and may serve to electrically separate the two 152 and 134 from each other. In addition, the insulating layer 140 may be disposed between the second bonding pad 154 and the first electrode 132 and may serve to electrically separate the two 154 and 132 from each other. The state in which the insulating layer 140 is disposed between the second bonding pad 154 and the first electrode 132 is illustrated in FIGS. 3a to 6b, which will be described later.

The insulating layer 140 may contain at least one of $SiO_2$, $TiO_2$, $ZrO_2$, $Si_3N_4$, $Al_2O_3$, or $MgF_2$. Alternatively, the insulating layer 140 may be a distributed Bragg reflector (DBR).

In addition, referring to FIG. 1, the first length L1 of the substrate 110 may be greater than the second length L2 of the branch electrode 132-1 in the first direction (e.g., the y-axis direction). For example, the relationship between first length L1 and the second length L2 may satisfy the following Equation 1.

$$L1 \times 0.7 > L2 \qquad \text{Equation 1}$$

For example, the first length L1 may be 1000 μm and the second length L2 may be 600 μm, but the embodiment is not limited thereto.

In addition, the third length L3 of the first bonding pad 152 in the first direction may be less than the first length L1 and may be less than the second length L2, and the fourth length L4 of the second bonding pad 154 in the first direction may be less than the first length L1 and may be less than the second length L2.

FIG. 3a illustrates a cross-sectional view of one embodiment 100A of the light-emitting device 100 taken along line II-II' of FIG. 1, and FIG. 3b illustrates an enlarged cross-sectional view of portion 'A' of FIG. 3a.

Referring to FIGS. 3a and 3b, the light-emitting device 100A includes the substrate 110, the light-emitting structure 120, a first electrode 132A, the second electrode 134, an insulating layer 140A, and the second bonding pad 154. Here, the substrate 110, the light-emitting structure 120, the first electrode 132A, the second electrode 134, the insulating layer 140A, and the second bonding pad 154 perform the same function as the substrate 110, the light-emitting structure 120, the first electrode 132, the second electrode 134, the insulating layer 140, and the second bonding pad 154, which are illustrated in FIG. 2, respectively, and thus a repeated description thereof will be omitted below. The first electrode 132A and the insulating layer 140A illustrated in FIGS. 3a and 3b correspond to one embodiment of the first electrode 132 and the insulating layer 140 illustrated in FIG. 2, respectively.

In the branch electrode 132-1 of the first electrode 132A, when the first thickness T1 of the first segment S1 is thick, for example, when the first thickness T1 is greater than ⅓ of the second thickness T2 of the insulating layer 140A, which is disposed between the second bonding pad 154 and the first electrode 132A, the insulating layer 140A may not be correctly formed, or may undergo crack formation or moisture invasion, and the slope of the first electrode 132A may be decreased, causing a stepped shape. Therefore, when the relationship between the first and second lengths L1 and L2 satisfies the above-described equation 1, the first thickness T1 may be ⅓ or less of the second thickness T2, but the embodiment is not limited thereto.

In addition, the third thickness T3, which corresponds to the depth of the contact hole CH, may be 700 nm and the fourth thickness T4 of the second electrode 134 may be 300 nm, but the embodiment is not limited thereto.

FIG. 4a illustrates a cross-sectional view of another embodiment 100B of the light-emitting device 100 taken along line II-II' of FIG. 1, and FIG. 4b illustrates an enlarged cross-sectional view of portion 'B' of FIG. 4a.

Referring to FIGS. 4a and 4b, the light-emitting device 100B includes the substrate 110, the light-emitting structure 120, a first electrode 132B, the second electrode 134, an insulating layer 140B, and the second bonding pad 154. Here, the substrate 110, the light-emitting structure 120, the first electrode 132B, the second electrode 134, the insulating layer 140B, and the second bonding pad 154 perform the same function as the substrate 110, the light-emitting structure 120, the first electrode 132, the second electrode 134, the insulating layer 140, and the second bonding pad 154, which are illustrated in FIG. 2, respectively, and thus a repeated description thereof will be omitted below. The first electrode 132B and the insulating layer 140B illustrated in FIGS. 4a and 4b correspond to another embodiment of the first electrode 132 and the insulating layer 140 illustrated in FIG. 2, respectively.

As illustrated in FIGS. 4a and 4b, in the first electrode 132B, a portion of the first segment S1 of the branch electrode 132-1 may be buried in the first conductive semiconductor layer 122. The thickness of the portion of the first electrode 132B that is exposed, rather than buried in the first conductive semiconductor layer 122, corresponds to the above-described first thickness T1. Therefore, when the relationship between the first and second lengths L1 and L2 satisfies the above-described equation 1, the first thickness T1 illustrated in FIG. 4b may be ⅓ or less of the second thickness T2.

Even when the thickness TT of the entire first electrode 132B is greater than ⅓ of the second thickness T2, as illustrated in FIGS. 4a and 4b, a portion of the first electrode 132B may be buried in the first conductive semiconductor layer 122, whereby the first thickness T1 becomes ⅓ or less of the second thickness T2. In this case, when the first thickness T1 of the first electrode 132 is increased, the current diffusion ability of the light-emitting device 100B may be improved and the insulating layer 140B may be correctly formed. Thereby, it is possible to prevent crack formation or moisture invasion in the insulating layer 140B and to prevent a deterioration in the slope of the first electrode 132B.

FIG. 5a illustrates a cross-sectional view of still another embodiment 100C of the light-emitting device 100 taken along line II-II' of FIG. 1, and FIG. 5b illustrates an enlarged cross-sectional view of portion 'C' of FIG. 5a.

Referring to FIGS. 5a and 5b, the light-emitting device 100C includes the substrate 110, the light-emitting structure 120, a first electrode 132C, the second electrode 134, an insulating layer 140C, and the second bonding pad 154. Here, the substrate 110, the light-emitting structure 120, the first electrode 132C, the second electrode 134, the insulating layer 140C, and the second bonding pad 154 perform the same function as the substrate 110, the light-emitting structure 120, the first electrode 132, the second electrode 134, the insulating layer 140, and the second bonding pad 154, which are illustrated in FIG. 2, respectively, and thus a repeated description thereof will be omitted below. The first electrode 132C and the insulating layer 140C illustrated in FIGS. 5a and 5b correspond to still another embodiment of the first electrode 132 and the insulating layer 140 illustrated in FIG. 2, respectively.

When the relationship between the first and second lengths L1 and L2 satisfies the above-described equation 1, the first thickness T1 may be ⅓ or less of the second thickness T2, but the embodiment is not limited thereto.

Referring to FIGS. 5a and 5b, the first electrode 132C includes an upper surface 132C-1, which faces the insulating layer 140C. Here, the upper surface 132C-1 of the first electrode 132C may have at least one first recess R1. When the upper surface 132C-1 of the first electrode 132C has the first recess, the insulating layer 140C disposed on the first electrode 132O may have at least one second recess R2 formed in an upper surface 140C-1 thereof. In this case, the first thickness T1 may be greater than the first thickness T1 of the first electrode 132A illustrated in FIGS. 3a and 3b. This is because, even if the first thickness T1 of the first electrode 132C illustrated in FIGS. 5a and 5b is greater than the first thickness T1 of the first electrode 132A illustrated in FIGS. 3a and 3b, the insulating layer 1400 may be correctly formed when the first recess R1 is filled with the insulating layer 140C, which may prevent crack formation or moisture invasion in the insulating layer 140C.

FIG. 6a illustrates a cross-sectional view of a still another embodiment 100D of the light-emitting device 100 taken along line II-II' of FIG. 1, and FIG. 6b illustrates an enlarged cross-sectional view of portion 'D' of FIG. 6a.

Referring to FIGS. 6a and 6b, the light-emitting device 100D includes the substrate 110, the light-emitting structure 120, a first electrode 132D, the second electrode 134, an insulating layer 140D, and the second bonding pad 154. Here, the substrate 110, the light-emitting structure 120, the first electrode 132D, the second electrode 134, the insulating layer 140D, and the second bonding pad 154 perform the same function as the substrate 110, the light-emitting structure 120, the first electrode 132, the second electrode 134, the insulating layer 140, and the second bonding pad 154, which are illustrated in FIG. 2, respectively, and thus a repeated description thereof will be omitted below. The first electrode 132D and the insulating layer 140D illustrated in FIGS. 6a and 6b correspond to still another embodiment of the first electrode 132 and the insulating layer 140 illustrated in FIG. 2, respectively.

Referring to FIGS. 6a and 6b, the first electrode 132D may include a plurality of sub-electrodes 132D-1 and 132D-2. In the case of FIGS. 6a and 6b, two sub-electrodes 132D-1 and 132D-2 are illustrated, but the embodiment is not limited thereto. That is, according to another embodiment, the first electrode 132D may include three or more sub-electrodes.

The sub-electrodes 132D-1 and 132D-2 may be spaced apart from each other by a predetermined distance d in a third direction, which is different from each of the first and second directions. Here, the third direction may be orthogonal to the first and second directions and may be the z-axis direction. In addition, the predetermined distance d may be set in consideration of processing tolerance to allow the insulating layer 140D to be buried.

The first sub-electrode 132D-1 may have a first-first thickness T11, and the second sub-electrode 132D-2 may have a first-second thickness T12. Here, the first-first and first-second thicknesses T11 and T12 may be the same as or different from each other.

When the relationship between the first and second lengths L1 and L2 satisfies the above-described equation 1, each of the first-first and first-second thicknesses T11 and T12 may be ⅓ or less of the second thickness T2, but the embodiment is not limited thereto.

As illustrated in FIGS. 6a and 6b, when the first electrode 132D is divided into the plurality of sub-electrodes 132D-1 and 132D-2, each of the first-first and first-second thicknesses T11 and T12 may be greater than the first thickness T1 of the first electrode 132A illustrated in FIGS. 3a and 3b. This is because the insulating layer 140D may be correctly formed by being buried in the space between the sub-electrodes 132D-1 and 132D-2, which may prevent crack formation or moisture invasion in the insulating layer 140D.

Meanwhile, in the light-emitting devices 100A to 100D according to the above-described embodiments, the first thickness T1, T11 or T12 may be 1 μm or less, and the second thickness T2 may be 3.3 μm or less. For example, the first thickness T1, T11 or T12 may be 0.5 μm, and the second thickness T2 may be 3.3 μm.

Hereinafter, a method of manufacturing the light-emitting device 100A illustrated in FIG. 3a will be described with reference to the accompanying drawings, but the embodiment is not limited thereto. That is, the light-emitting device 100A illustrated in FIG. 3a may of course be manufactured by any other manufacturing method. In addition, the light-emitting devices 100B, 100C and 100D illustrated in FIGS. 4a, 5a and 6a may be manufactured by modifications of the process cross-sectional views illustrated in FIGS. 7a to 7f.

FIGS. 7a to 7f are process cross-sectional views for explaining a method of manufacturing the light-emitting device 100A illustrated in FIG. 3a.

Referring to FIG. 7a, the light-emitting structure 120 is formed on the substrate 110. The substrate 110 may be formed of a conductive material or a non-conductive material. For example, the substrate 110 may be formed by at least one of sapphire ($Al_2O_3$), GaN, SiC, ZnO, GaP, InP, $Ga_2O_3$, GaAs and Si. In addition, in order to assist light emitted from the active layer 124 in escaping from the light-emitting device 100, the substrate 110 may be, for example, a patterned sapphire substrate (PSS), but the embodiment is not limited thereto.

The light-emitting structure 120 may be formed by sequentially stacking the first conductive semiconductor layer 122, the active layer 124, and the second conductive semiconductor layer 126 on the substrate 110.

The first conductive semiconductor layer 122 may be formed of a semiconductor compound such as, for example, a group III-V or II-VI semiconductor compound, which is doped with a first conductive dopant. When the first conductive semiconductor layer 122 is an n-type semiconductor layer, the first conductive dopant may include Si, Ge, Sn, Se, or Te as an n-type dopant, without being limited thereto.

For example, the first conductive semiconductor layer 122 may be formed using a semiconductor material having a composition formula of $Al_xIn_yGa_{(1-x-y)}N$ ($0 \le x \le 1$, $0 \le y \le 1$, $0 \le x+y \le 1$). The first conductive semiconductor layer 122 may be formed of any one or more selected from among GaN, InN, AlN, InGaN, AlGaN, InAlGaN, AlInN, AlGaAs, InGaAs, AlInGaAs, GaP, AlGaP, InGaP, AlInGaP, and InP.

The active layer 124 may be formed to have at least one structure among a single-well structure, a multi-well structure, a single-quantum well structure, a multi-quantum well (MQW) structure, a quantum wire structure, and a quantum dot structure.

The well layer and the barrier layer of the active layer 124 may have a pair structure of any one or more selected from among InGaN/GaN, InGaN/InGaN, GaN/AlGaN, InAlGaN/GaN, GaAs(InGaAs)/AlGaAs, and GaP(InGaP)/AlGaP, without being limited thereto. The well layer may be formed of a material having lower band gap energy than the band gap energy of the barrier layer.

A conductive clad layer (not illustrated) may be formed on and/or under the active layer 124. The conductive clad layer may be formed of a semiconductor having higher band gap energy than the band gap energy of the barrier layer of the active layer 124. For example, the conductive clad layer may include, for example, a GaN, AlGaN, InAlGaN or super-lattice structure. In addition, the conductive clad layer may be doped to an n-type or a p-type.

The second conductive semiconductor layer 126 may be disposed on the active layer 124 and may be formed of a semiconductor compound. The second conductive semiconductor layer 126 may be formed of, for example, a group III-V or II-VI semiconductor compound. For example, the second conductive semiconductor layer 126 may be formed using a semiconductor material having a composition formula of $In_xAl_yGa_{(1-x-y)}N$ ($0 \leq x \leq 1$, $0 \leq y \leq 1$, $0 \leq x+y \leq 1$). The second conductive semiconductor layer 126 may be doped with a second conductive dopant. When the second conductive semiconductor layer 126 is a p-type semiconductor layer, the second conductive dopant may include Mg, Zn, Ca, Sr, Ba, or the like as a p-type dopant.

Subsequently, referring to FIG. 7b, a plurality of contact holes CH may be formed by mesa-etching the second conductive semiconductor layer 126, the active layer 124, and a portion of the first conductive semiconductor layer 122 of the light-emitting structure 120.

Subsequently, referring to FIG. 7c, the second electrode 134 may be formed on the second conductive semiconductor layer 126. The second electrode 134 may be formed on the second conductive semiconductor layer 126 of the light-emitting structure 120. The second electrode 134 may be formed to have a light-transmitting electrode layer (not illustrated) and a reflective layer (not illustrated).

The light-transmitting electrode layer may be formed on the second conductive semiconductor layer 126 and may be a transparent conductive oxide (TCO) layer. For example, the light-transmitting electrode layer may be formed using at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, and Ni/IrOx/Au/ITO, but is not limited to these materials.

The reflective layer may be disposed on the light-transmitting electrode layer, and may be configured with aluminum (Al), gold (Au), silver (Ag), nickel (Ni), platinum (Pt), rhodium (Rh), titanium (Ti), chrome (Cr), or a metal layer containing an alloy including Al, Ag, Pt or Rh.

Subsequently, referring to FIG. 7d, a metal mask MM is formed to expose the area in which the first electrode 132A is to be formed and to cover the light-emitting structure 120 and the second electrode 134.

FIG. 8 is an enlarged process cross-sectional view illustrating portion 'E' of FIG. 7d.

Referring to FIGS. 7d and 8, the first electrode 132A is formed by filling the portion that is exposed by the metal mask MM with a metal material. Subsequently, as illustrated in FIG. 7e, the metal mask MM is removed to completely form the first electrode 132A. Referring to FIG. 8, it will be appreciated that, when attempting to form the thick first electrode 132A, the first electrode 132A may be formed so as to have a steep side and a void may be generated.

As described above, the first electrode 132A may be formed after the second electrode 132 is formed, but the embodiment is not limited thereto. That is, according to another embodiment, the second electrode 134 may be formed after the first electrode 132A is formed, or the first and second electrodes 132A and 134 may be formed at the same time.

In addition, the first electrode 132A may be formed of any material that may not absorb the light emitted from the active layer 124, but that may reflect or transmit the light and that may be grown to a good quality on the first conductive semiconductor layer 122. For example, the first electrode 132A may be formed of a metal, and may be formed of Ag, Ni, Ti, Al, Rh, Pd, Ir, Ru, Mg, Zn, Pt, Au, Hf, Cr, or a selective combination thereof.

Subsequently, referring to FIG. 7f, the insulating layer 140A is formed to expose the second electrode 134 and to cover the first electrode 132 and the light-emitting structure 120. For example, the insulating layer 140A may be formed by a physical vapor deposition (PVD) method, but the embodiment is not limited thereto. The insulating layer 140A may be formed using at least one of $SiO_2$, $TiO_2$, $ZrO_2$, $Si_3N_4$, $Al_2O_3$, or $MgF_2$. Alternatively, the insulating layer 140A may be a distributed Bragg reflector (DBR).

Subsequently, referring to FIG. 3a, the second bonding pad 154 is formed so as to be electrically connected to the second electrode 134, which is exposed by the insulating layer 140A. At this time, although not illustrated, the first bonding pad 152 illustrated in FIG. 2 may be formed together when the second bonding pad 154 is formed.

Each of the first and second bonding pads 152 and 154 may be formed of a metal material having electrical conductivity, and may be formed of a material that is different from or the same as a corresponding one of the first and second electrodes 132A and 134. Although each of the first and second bonding pads 152 and 154 may be formed by at least one of Ti, Ni, Au, or Sn, the embodiment is not limited thereto.

FIG. 9 illustrates a cross-sectional view of a light-emitting device package 200 according to an embodiment.

The light-emitting device package 200 illustrated in FIG. 9 may include the light-emitting device 100, first and second lead frames 212 and 214, an insulator 216, a package body 220, a molding member 230, and first and second solder parts 242 and 244.

The light-emitting device 100 illustrated in FIG. 9 corresponds to the light-emitting device illustrated in FIG. 2, but the embodiment is not limited thereto.

The first solder part 242 is disposed between the first bonding pad 152 and the first lead frame 212 and serves to electrically connect the two 152 and 212 to each other. The second solder part 244 is disposed between the second bonding pad 154 and the second lead frame 214 and serves to electrically connect the two 154 and 214 to each other.

Although each of the first and second solder parts 242 and 244 may be a solder paste or a solder ball, the embodiment is not limited thereto.

As described above, the first solder part 242 may electrically connect the first conductive semiconductor layer 122 to the first lead frame 212 via the first bonding pad 152, and the second solder part 244 may electrically connect the second conductive semiconductor layer 126 to the second lead frame 214 via the second bonding pad 154.

In addition, the first solder part 242 and the second solder part 244 may be omitted. In this case, the first bonding pad 152 may serve as the first solder part 242, and the second bonding pad 154 may serve as the second solder part 244. That is, when the first solder part 242 and the second solder part 244 are omitted, the first bonding pad 152 may be directly connected to the first lead frame 212, and the second bonding pad 154 may be directly connected to the second lead frame 214.

The first lead frame 212 may be electrically connected to the first bonding pad 152 via the first solder part 242, and the second lead frame 214 may be electrically connected to the second bonding pad 154 via the second solder part 244. The first and second lead frames 212 and 214 may be electrically spaced apart from each other by the insulator 216. Each of the first and second lead frames 212 and 214 may be formed of a conductive material, for example, a metal, and the embodiment is not limited as to the type of a material of each of the first and second lead frames 212 and 214.

The insulator 216 is disposed between the first and second lead frames 212 and 214, and electrically insulates the first and second lead frames 212 and 214 from each other. To this end, the insulator 216 may contain at least one of $SiO_2$, $TiO_2$, $ZrO_2$, $Si_3N_4$, $Al_2O_3$, or $MgF_2$, but the embodiment is not limited thereto.

In addition, the package body 220 may define a cavity CV in conjunction with the first and second lead frames 212 and 214, but the embodiment is not limited thereto. According to another embodiment, the package body 220 may define the cavity CV alone. Alternatively, a barrier wall (not illustrated) may be disposed on the package body 220 having a flat upper surface so that the cavity CV may be defined by the barrier wall and the upper surface of the package body 220.

The light-emitting device 100 illustrated in FIG. 2 may be disposed in the cavity CV. The package body 220 may be formed using silicon, a synthetic resin, or a metal. When the package body 220 is formed of a conductive material, for example, a metal, the first and second lead frames 212 and 214 may be a portion of the package body 220. Even in this case, the package body 220 forming the first and second lead frames 212 and 214 may be electrically separated by the insulator 216.

In addition, the molding member 230 may be disposed so as to surround and protect the light-emitting device 100 disposed in the cavity CV. The molding member 230 may be formed of, for example, silicon (Si), and may change the wavelength of light emitted from the light-emitting device 100 because it includes a fluorescent substance. Although the fluorescent substance may include any fluorescent material of the wavelength change element that may change the light generated in the light-emitting device 100 into white light, such as a YAG-based, TAG-based, silicate-based, sulfide-based, or nitride-based fluorescent substance, the embodiment is not limited as to the type of the fluorescent substance.

The YAG-based and TAG-based fluorescent material may be selected from among (Y, Tb, Lu, Sc, La, Gd, Sm)3(Al, Ga, In, Si, Fe)5(O, S)12:Ce, and the silicate-based fluorescent substance may be selected from among (Sr, Ba, Ca, Mg)2SiO_4:(Eu, F, Cl).

In addition, the sulfide-based fluorescent material may be selected from among (Ca, Sr)S:Eu and (Sr, Ca, Ba) (Al, Ga)2S4:Eu, and the nitride-based fluorescent substance may be selected from among (Sr, Ca, Si, Al, O)N:Eu (e.g., CaAlSiN4:Eu β-SiAlON:Eu) and (Cax, My)(Si, Al)12(O,N) 16, which is based on Ca-α SiAlON:Eu (where M is at least one material of Eu, Tb, Yb, or Er, 0.05<(x+y)<0.3, 0.02<x<0.27 and 0.03<y<0.3).

As a red fluorescent substance, a nitride-based fluorescent substance including N (e.g., $CaAlSiN_3$:Eu) may be used. Such a nitride-based red fluorescent substance may have higher reliability with respect to the external environment such as, for example, heat and moisture, and lower discoloration possibility than a sulfide-based fluorescent substance.

FIG. 10a illustrates a plane photograph of a light-emitting device according to a comparative example, FIG. 10b illustrates a cross-sectional photograph of the light-emitting device according to the comparative example of FIG. 10a, and FIG. 10c illustrates an enlarged cross-sectional photograph of the light-emitting device according to the comparative example of FIG. 10b.

FIG. 11 illustrates a cross-sectional photograph of portion 'A' of the light-emitting device 100 according to the embodiment of FIG. 3b.

The branch electrode 132-1 and the contact electrode 132-2 of the light-emitting device according to the comparative example illustrated in FIG. 10a may perform the same function as the branch electrode 132-1 and the contact electrode 132-2 of the light-emitting device 100 according to the embodiment illustrated in FIG. 1, respectively.

When the first thickness T1 of the first electrode 132 is increased, the current diffusion ability of the light-emitting device 100 may be improved. However, when the first thickness T1 is excessively increased, the insulating layer 140 may not be correctly formed, which may cause defects in the first electrode 132.

For example, in the light-emitting device according to the comparative example, when the first thickness T1 of the first electrode 132 is 1.5 µm, leakage 302 or 304 may occur due to cracks in the insulating layer 140, or moisture invasion may occur through a void 306, as illustrated in FIG. 10c. In addition, the slope of the first electrode 132 may be deteriorated, which causes the first electrode 132 to be stepped. In conclusion, the electrical characteristics of the light-emitting device according to the comparative example may be deteriorated when the first electrode is thick.

To solve this, in the light-emitting devices 100, 100A to 100D and the light-emitting device package 200 according to the above-described embodiment, the first thickness T1, T11, T12 of the first electrode 132, 132A to 132D is ⅓ or less of the second thickness T2 of the insulating layer 140, 140A to 140D, and is less than the thickness of the first electrode in the light-emitting device according to the comparative example. For example, when the first thickness T1, T11, T12 of the first electrode 132, 132A to 132D is 0.5 µm, as illustrated in FIG. 11, the insulating layer 140, 140A to 140D may be correctly formed and the slope of the first electrode 132, 132A to 132D may be improved, which may prevent the occurrence of defects in the first electrode 132, 132A to 132D. In conclusion, the light-emitting device according to the embodiment may have electrical characteristics superior to those of the light-emitting device according to the comparative example.

A plurality of light-emitting device packages according to the embodiment may be arranged on a board, and optical members such as, for example, a light guide plate, a prism sheet, and a diffuser sheet may be disposed on the optical path of the light-emitting device packages. The light-emitting device packages, the board, and the optical members may function as a backlight unit.

In addition, the light-emitting device package according to the embodiment may be included in a display apparatus, an indicator apparatus, or a lighting apparatus.

Here, the display apparatus may include a bottom cover, a reflector disposed on the bottom cover, a light-emitting module that emits light, a light guide plate disposed in front of the reflector to guide light emitted from the light-emitting module forward, an optical sheet including prism sheets disposed in front of the light guide plate, a display panel disposed in front of the optical sheet, an image signal output circuit connected to the display panel to supply an image signal to the display panel, and a color filter disposed in front of the display panel. Here, the bottom cover, the reflector, the light-emitting module, the light guide plate, and the optical sheet may form a backlight unit.

In addition, the lighting apparatus may include a light source module that includes a board and the light-emitting device package according to the embodiment, a radiator that dissipates heat of the light source module, and a power supply unit that processes or converts an electrical signal received from the outside to provide the same to the light source module. For example, the lighting apparatus may include a lamp, a headlamp, or a street light.

The headlamp may include a light-emitting module that includes light-emitting device packages disposed on a board, a reflector that reflects light emitted from the light-emitting module in a given direction, for example, in the forward direction, a lens that refracts light reflected by the reflector forward, and a shade that blocks or reflects some of the light, which has been reflected by the reflector to thereby be directed to the lens, so as to realize the light distribution pattern desired by a designer.

Although the embodiments have been described above, the embodiments described above are merely provided by way of example and are not intended to limit the disclosure, and it will be apparent to those skilled in the art that various modifications and applications not described above may be devised without departing from the essential characteristics of the embodiments. For example, respective components concretely described in the embodiments may be altered. In addition, differences related to these modifications and applications should be construed as being included in the scope of the embodiments defined in the accompanying claims.

[Mode for Invention]

Modes for carrying out the embodiments have sufficiently been described in the "best mode".

INDUSTRIAL APPLICABILITY

A light-emitting device and a light-emitting device package according to embodiments may be used in, for example, a display apparatus, an indicator apparatus, or a lighting apparatus such as a lamp, a head lamp or a street lamp.

The invention claimed is:

1. A light-emitting device, comprising:
a substrate;
a light-emitting structure disposed on the substrate and including a first conductive semiconductor layer, an active layer, and a second conductive semiconductor layer;
first and second electrodes connected respectively to the first and second conductive semiconductor layers, the first electrode being disposed in a contact hole, wherein the contact hole penetrates the second conductive semiconductor layer and the active layer and exposes the first conductive semiconductor layer;
first and second bonding pads connected respectively to the first and second electrodes; and
an insulating layer disposed between the first bonding pad and the second electrode to electrically separate the first bonding pad from the second electrode, and disposed between the second bonding pad and the first electrode to electrically separate the second bonding pad from the first electrode,
wherein the first electrode includes:
a branch electrode disposed under the first and second bonding pads; and
a contact electrode disposed under the first bonding pad,
wherein the branch electrode includes a first segment disposed under the second bonding pad,
wherein the first segment includes:
a first upper surface facing the second bonding pad; and
a lower surface opposite to the first upper surface and facing the substrate,
wherein a portion of the first segment of the branch electrode is buried in the first conductive semiconductor layer so that the lower surface of the first segment is closer to the substrate than a bottom surface of the contact hole,
wherein the first electrode has a first thickness that is ⅓ or less of a second thickness of a portion of the insulating layer disposed on the first electrode and between the second bonding pad and the first electrode, and
wherein the first thickness is a thickness of a portion of the first electrode that is exposed without being buried in the first conductive semiconductor layer.

2. The light-emitting device according to claim 1, wherein the branch electrode further includes:
a second segment disposed under the first bonding pad.

3. The light-emitting device according to claim 1, wherein the substrate has a first length and the branch electrode has a second length in a first direction, and the first length and the second length have a following relationship;

$$L1 \times 0.7 > L2$$

(where, L1 indicates the first length and L2 indicates the second length), and
wherein the first and second bonding pads are spaced apart from each other in the first direction, which is orthogonal to a thickness direction of the light-emitting structure.

4. The light-emitting device according to claim 2, wherein the branch electrode further includes a third segment disposed between the first segment and the second segment.

5. The light-emitting device according to claim 1, wherein the first thickness is 1 μm or less and the second thickness is 3.3 μm or less.

6. The light-emitting device according to claim 1, wherein the first electrode includes a plurality of sub-electrodes spaced apart from one another in a direction that is orthogonal to a thickness direction of the light-emitting structure.

7. The light-emitting device according to claim 6, wherein the insulating layer is buried between the sub-electrodes.

8. The light-emitting device according to claim 6, wherein the sub-electrodes have different thicknesses.

9. The light-emitting device according to claim 6, wherein the sub-electrodes have the same thickness.

10. The light-emitting device according to claim 6, wherein the sub-electrodes are spaced apart from one another by a distance that is determined in consideration of a processing error to allow the insulating layer to be buried.

11. The light-emitting device according to claim 1, wherein the insulating layer is overlapped in a thickness direction of the light-emitting structure with the first upper surface of the first segment, and is overlapped in the thickness direction of the light-emitting structure with the second bonding pad, the insulating layer including a second upper surface facing the second bonding pad, and
   wherein the second upper surface of the insulating layer has at least one first recess therein.

12. The light-emitting device according to claim 1, wherein the first bonding pad and the second bonding pad face each other in a first direction,
   wherein the first bonding pad has a length in the first direction that is less than a length of the substrate in the first direction, and
   wherein the second bonding pad has a length in the first direction that is less than the length of the substrate in the first direction.

13. The light-emitting device according to claim 1, wherein the first bonding pad and the second bonding pad face each other in a first direction,
   wherein the first bonding pad has a length in the first direction that is less than a length of the branch electrode in the first direction, and
   wherein the second bonding pad has a length in the first direction that is less than the length of the branch electrode in the first direction.

14. A light-emitting device package comprising:
the light-emitting device according to claim 1;
first and second solder parts connected respectively to the first and second bonding pads; and
first and second lead frames electrically connected respectively to the first and second solder parts.

* * * * *